US012733597B1

(12) United States Patent
Deng

(10) Patent No.: US 12,733,597 B1
(45) Date of Patent: Sep. 15, 2026

(54) HIGH ENERGY EFFICIENCY LASER LIGHTING SYSTEM AND METHOD FOR HIGH-VALUE PLANTATION

(71) Applicant: Xiaowen Deng, San Jose, CA (US)

(72) Inventor: Xiaowen Deng, San Jose, CA (US)

( * ) Notice: Subject to any disclaimer, the term of this patent is extended or adjusted under 35 U.S.C. 154(b) by 0 days.

(21) Appl. No.: 19/196,949

(22) Filed: May 2, 2025

Related U.S. Application Data

(63) Continuation-in-part of application No. 19/079,463, filed on Mar. 14, 2025, now abandoned.

(51) Int. Cl.

| | |
|---|---|
| ***A01G 9/24*** | (2006.01) |
| ***A01G 7/04*** | (2006.01) |
| ***A01G 9/26*** | (2006.01) |
| ***F21V 21/15*** | (2006.01) |
| ***G06V 20/10*** | (2022.01) |
| ***H01S 5/042*** | (2006.01) |
| ***H04N 13/243*** | (2018.01) |
| ***H04N 13/271*** | (2018.01) |
| *F21Y 115/30* | (2016.01) |
| *G02B 26/12* | (2006.01) |

(52) U.S. Cl.
CPC ............. *A01G 9/249* (2019.05); *A01G 7/045* (2013.01); *A01G 9/26* (2013.01); *F21V 21/15* (2013.01); *G06V 20/188* (2022.01); *H01S 5/0428* (2013.01); *H04N 13/243* (2018.05); *H04N 13/271* (2018.05); *F21Y 2115/30* (2016.08); *G02B 26/12* (2013.01)

(58) Field of Classification Search
CPC .......... A01G 9/249; A01G 7/045; A01G 9/26; F21V 21/15; G06V 20/188; H01S 5/0428; H04N 13/243; H04N 13/271; F21Y 2115/30; G02B 26/12
See application file for complete search history.

(56) References Cited

U.S. PATENT DOCUMENTS

| | | | | |
|---|---|---|---|---|
| 11,978,210 B1 * | 5/2024 | Wei | ........................... | G06T 7/62 |
| 2015/0035437 A1 * | 2/2015 | Panopoulos | ............ | B60L 53/12 315/291 |
| 2021/0112647 A1 * | 4/2021 | Coleman | ................ | F21V 14/02 |

* cited by examiner

*Primary Examiner* — Minh Tran
(74) *Attorney, Agent, or Firm* — NKL Law; Allen Xue

(57) ABSTRACT

A laser lighting system for indoor high-value cultivation is disclosed. The system includes: a laser light source module for providing laser lighting for the system; a camera module for monitoring and measuring conditions of plants; a plurality of y-tracks for supporting and guiding movements of at least the laser light source module along the y-direction; a plurality of x-tracks for supporting and guiding movements of at least the laser light source module along the x-direction; at least a y-step motor for driving the laser light source module; at least an x-step motor for driving the laser light source module; and a controller module connecting the laser light source module, the camera module, the y-step motor and x-step motor, the controller module controls the y-step motor, x-step motor, and the laser light source module in response to inputs received from the camera module.

16 Claims, 10 Drawing Sheets

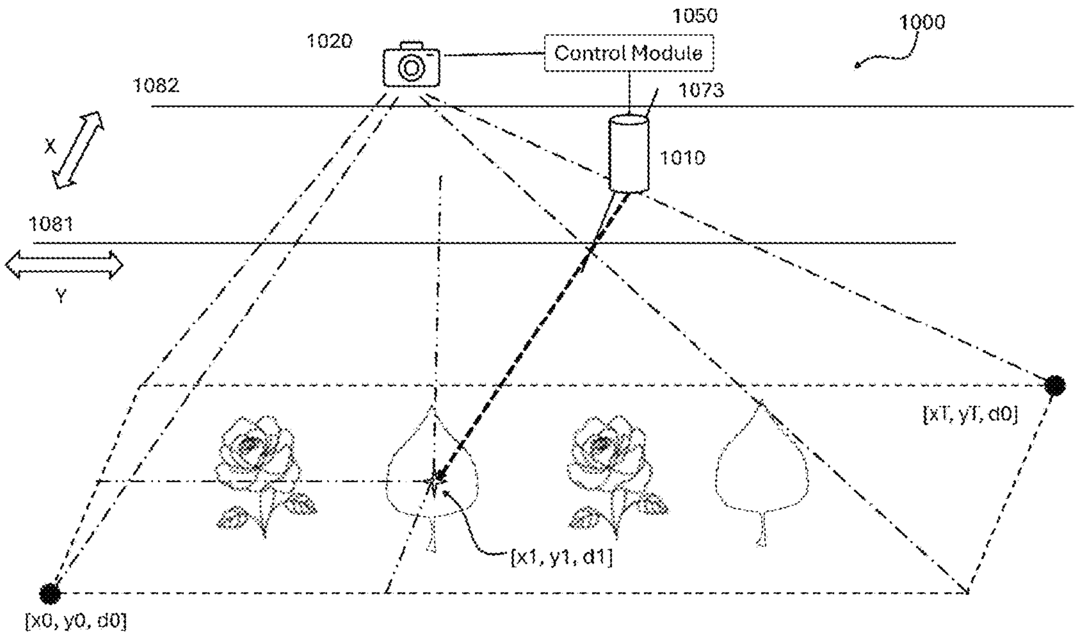
FIG. 3A
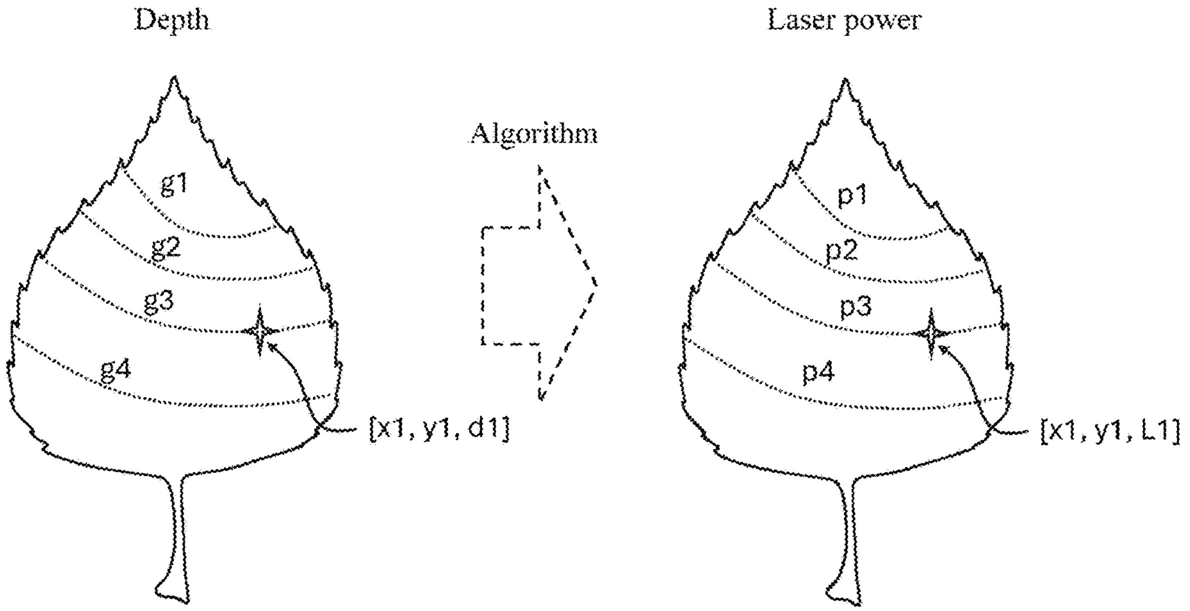
FIG. 3B
FIG. 3C

HIGH ENERGY EFFICIENCY LASER LIGHTING SYSTEM AND METHOD FOR HIGH-VALUE PLANTATION

FIELD OF INVENTION

The present invention relates to high-value plantation growth lighting system and method, and in particular to high energy efficiency laser lighting system and method for high-value plantation.

BACKGROUND OF INVENTION

Indoor cultivation of high-value crops like flowers, trees and hops is evolving rapidly, driven by technological advancements and market demands.

Advanced cultivation techniques for indoor growing focus on optimizing environmental conditions to maximize yield and quality. Indoor cultivation of high-value crops such as flowers, trees and hops has seen significant advancements, driven by technology and efficiency improvements. One of the key aspects is air temperature and humidity control, as maintaining ideal conditions ensures optimal plant growth. Temperature requirements vary by crop, but for hops, it is best kept between 60-65° F. (16-18° C.) during the vegetative stage and 60° F. to 70° F. (15° C. to 21° C.) during flowering. Many growers now incorporate automated systems equipped with sensors and controllers to regulate temperature, humidity, and $CO_2$ levels in real time, ensuring consistency. Additionally, increasing $CO_2$ levels to approximately 1200 ppm enhances photosynthesis and leads to greater yields.

Lighting optimization plays a vital role in indoor cultivation, as the light spectrum directly affects plant growth and development. LED grow lights have become the industry standard due to their energy efficiency and ability to provide precise light wavelengths tailored to different growth stages. Light cycles are also carefully managed, with hops requiring 18 hours of light during the vegetative stage and 12 hours during flowering to trigger bud production. The spectral composition of the light source is another critical factor—red wavelengths encourage flowering, whereas blue wavelengths enhance vegetative development. With recent innovations, growers can fine-tune lighting setups to optimize production while minimizing energy consumption.

Laser lighting, a newer innovation in indoor cultivation, offers even greater precision in delivering specific light wavelengths. Unlike LEDs, which emit light in a broader spectrum, lasers produce highly focused, monochromatic light, ensuring that plants receive exactly the wavelengths needed for photosynthesis. This reduces light waste and enhances energy efficiency. Laser lighting also provides deeper canopy penetration, ensuring that lower leaves receive adequate light exposure, which can be a challenge with traditional LED setups.

The following is a comparison of laser lighting versus LED lighting for indoor cultivation of high-value crops:

| Feature | LED Lighting | Laser Lighting |
|---|---|---|
| Light Spectrum | Full-spectrum (350 nm-800 nm), adjustable | Monochromatic, highly precise |
| Energy Efficiency | High, but some light waste | Extremely efficient, minimal waste |
| Heat Emission | Low | Very low |
| Canopy Penetration | Moderate | Deep penetration, reaching lower leaves |
| Cost | High | Low |

While LED lighting remains the dominant choice for indoor cultivation due to its affordability and versatility, laser lighting is gaining traction for its efficiency and precision. Growers looking to maximize energy savings and optimize light delivery may find laser technology to be a promising alternative, particularly for high-value crops like flowers, trees and hops.

Laser diodes available on the market vary widely in terms of wavelength, power output, control mechanisms, and cost, making them suitable for different applications in indoor cultivation. These semiconductor-based lasers convert electrical energy into coherent light and are commonly used in industries such as telecommunications, medical imaging, and precision manufacturing. Their potential in agriculture, however, particularly for indoor farming, is gaining attention.

Off-the-shelf laser diodes typically range from 375 nm to 2000 nm in wavelength. Shorter wavelengths, such as blue (430-485 nm) and red (620-660 nm) lasers, are particularly relevant for plant growth, as they align with the absorption peaks of chlorophyll. Near-infrared lasers (750-1550 nm) can also be beneficial for stimulating photosynthesis and enhancing plant metabolism. Power output varies significantly, from 0.2 mW to 2 W, depending on the diode type and intended application. Higher-power diodes can penetrate deeper into plant canopies, ensuring uniform light distribution.

Laser diodes offer precise control over light intensity and wavelength, making them advantageous for indoor cultivation. Unlike traditional LED systems, lasers produce monochromatic light, meaning they emit a single, highly targeted wavelength. This precision allows growers to fine-tune light exposure for different growth stages. Many laser diodes come with pulse width modulation and current control features, enabling dynamic adjustments to optimize plant development.

The cost of laser diodes varies based on wavelength, power, and packaging. Low-power consumer-grade diodes can be purchased for under a dollar, while high-performance industrial-grade lasers can cost thousands of dollars. Red laser diodes (620-660 nm) used in consumer electronics are relatively inexpensive due to mass production, whereas specialized wavelengths for biomedical or agricultural applications command higher prices.

Laser lighting presents several advantages over traditional LED systems for indoor farming. Its high efficiency and minimal light waste make it an attractive option for precision agriculture. Additionally, laser diodes provide deep canopy penetration, ensuring lower leaves receive adequate light exposure. However, challenges remain, including potential safety concerns related to laser exposure. While LEDs remain the dominant choice for indoor cultivation, laser technology is emerging as a viable alternative for growers seeking maximum energy efficiency and spectral precision.

SUMMARY OF INVENTION

A laser lighting system for plantation growth includes a laser module (LM) or high-intensity light source device, an x-step motor, a y-step motor, a detection 3D camera and a controller module. The laser lighting system of the present invention is implemented for multi-layer hydroponic or soil-based plantation growth facilities to provide wide range of light intensity according to the requirement of diverse plantation species, and different height at each growth stage of plantation. The light intensity of laser module can be manipulated with controller module by adjusting the on-cycle of PWM pulse width modulation waveform. The laser light intensity can also be fine-tuned by adjusting the moving speed, or scanning speed, of laser module. As a result, the plurality of plant species grows well with proper laser light intensity with or without a closed environment. Energy efficiency is much higher because the laser light intensity and the scope of lighting are fully controllable in the present invention.

A laser lighting system for indoor high-value cultivation is disclosed. According to an embodiments of the invention, the laser lighting system for indoor high-value cultivation includes: a laser light source module for providing laser lighting for the laser lighting system for indoor high-value cultivation; a camera module for monitoring and measuring conditions of plants being cultivated; a plurality of y-tracks extending in a y-direction for supporting and guiding movements of at least the laser light source module along the y-direction; a plurality of x-tracks extending in an x-direction for supporting and guiding movements of at least the laser light source module along the x-direction, the x-direction is perpendicular to the y-direction, both the x-direction and the y-direction are in a horizontal plane; at least a y-step motor for driving at least the laser light source module along the plurality of y-tracks; at least an x-step motor for driving at least the laser light source module along the plurality of x-tracks; and a controller module connecting the laser light source module, the camera module, the at least one y-step motor and the at least one x-step motor, the controller module controls the at least one y-step motor, the at least one x-step motor, and the laser light source module for providing lighting to the crops in response to inputs received from the camera module.

According to an embodiment of the invention, the laser lighting system for indoor high-value cultivation, the laser light source module provides more than one wavelength of laser. According to an embodiment of the invention, laser light intensity can be manipulated by adjusting the PWM duty cycle of the laser light source module or the movement of the x-step motor and γ-step motor. According to an embodiment of the invention, the laser light source module is implemented as a bundle of optic fibers, wherein each of the optic fibers within the bundle provides a beam of laser with an independent wavelength, power and PWM duty cycle. According to an embodiment of the invention, the camera module further comprises a 3D camera. According to an embodiment of the invention, the camera module further comprises a Time-Of-Flight (TOF) sensor. According to an embodiment of the invention, the camera module further comprises a structured-light 3D scanner. According to an embodiment of the invention, the camera module further comprises an RGB-D stereo camera. According to an embodiment of the invention, the camera module captures a picture of plants being cultivated with depth information of each pixel in the picture, wherein an AI machine vision method is implemented to identify species of the plants being cultivated to facilitate a determination of optimal laser light source wavelengths and power intensities for optimal plant cultivation. According to an embodiment of the invention, the depth information of each pixel in the picture captured by the camera module is implemented to facilitate the determination of optimal laser light source wavelengths and power intensities for optimal plant cultivation.

According to an embodiment of the invention, a method for controlling a laser lighting system for an indoor high-value cultivation environment of plants is disclosed. The method includes: deploying a 3D camera above the plants in the indoor high-value cultivation environment, wherein the 3D camera captures a picture of the plants with depth information for each pixel in the picture; deploying a laser lighting module in the indoor high-value cultivation environment of plants, wherein a beam of laser light of the laser lighting module is implemented to reach each location associated with each of the pixel in the picture; identifying species of the plants in the picture with an AI machine vision module; constructing a depth frame with the depth information corresponding to the picture; determining an optimal laser wavelength, an optimal laser power intensity, and an optimal laser PWM duty cycle for each pixel in the picture; constructing a laser lighting module output power pattern with the optimal laser wavelength, the optimal laser power intensity and the optimal laser PWM duty cycle for each pixel in the picture; and shooting a beam of laser light to a location associated with a pixel in the picture with the optimal laser wavelength, the optimal laser power intensity and the optimal laser PWM duty cycle associated with the pixel.

According to an embodiment of the invention, the method further includes: shooting a second beam of laser light to a second location associated with a second pixel in the picture with the optimal laser wavelength, the optimal laser power intensity and the optimal laser PWM duty cycle associated with the second pixel. According to an embodiment of the invention, the method further includes: for each of the pixel in the picture, shooting a beam of laser light with an optimal laser wavelength, an optimal laser power intensity and an optimal laser PWM duty cycle associated with the each of the pixel in the picture. According to an embodiment of the invention, at least an x-step motor and a y-step motor are implemented for the laser lighting module to reach each location associated with each of the pixel in the picture. According to an embodiment of the invention, a prism is implemented for the laser lighting module to reach each location associated with each of the pixel in the picture. According to an embodiment of the invention, an array of optic fibers are implemented for the laser lighting module to reach each location associated with each of the pixel in the picture.

According to an embodiment of the invention, an integrated laser lighting system for indoor high-value cultivation is disclosed. The integrated laser lighting system for indoor high-value cultivation includes: a laser light source module for providing laser lighting for the laser lighting system for indoor high-value cultivation; a camera module for monitoring and measuring conditions of plants being cultivated; and a controller module connecting the laser light source module, the camera module, wherein the laser light source module, the camera module and the controller module are integrated together. According to an embodiment of the invention, an oscillating mirror is implemented as a scanning mechanism for the laser light source module. According to an embodiment of the invention, a rotating polygon mirror is implemented as a scanning mechanism for the laser light source module. According to an embodiment of the invention, a MEMS array is implemented as a scanning mechanism for the laser light source module. According to an embodiment of the invention, a fiber-optic scanner is implemented as a scanning mechanism for the laser light source module.

BRIEF DESCRIPTION OF THE FIGURES

The invention will now be explained in more detail using exemplary embodiments and with references to the drawings, in which:

FIG. 3A is a perspective view of the high energy efficiency laser lighting system for high-value plantation, according to an embodiment of the invention.

FIG. 3B is a schematic diagram of a depth frame of an exemplary piece of leaf, according to an embodiment of the invention.

FIG. 3C is a schematic diagram of a laser power intensity of the exemplary piece of leaf in FIG. 3B, according to an embodiment of the invention.

DETAILED DESCRIPTION OF PREFERRED EMBODIMENTS

The invention is susceptible to many embodiments. Preferred embodiments are illustrated in the attached figures and explained below. Minor variations of the preferred embodiments are evident in the figures, but are substantially the same, with common or similar components and the same reference numbers, except as noted.

Figure 1:
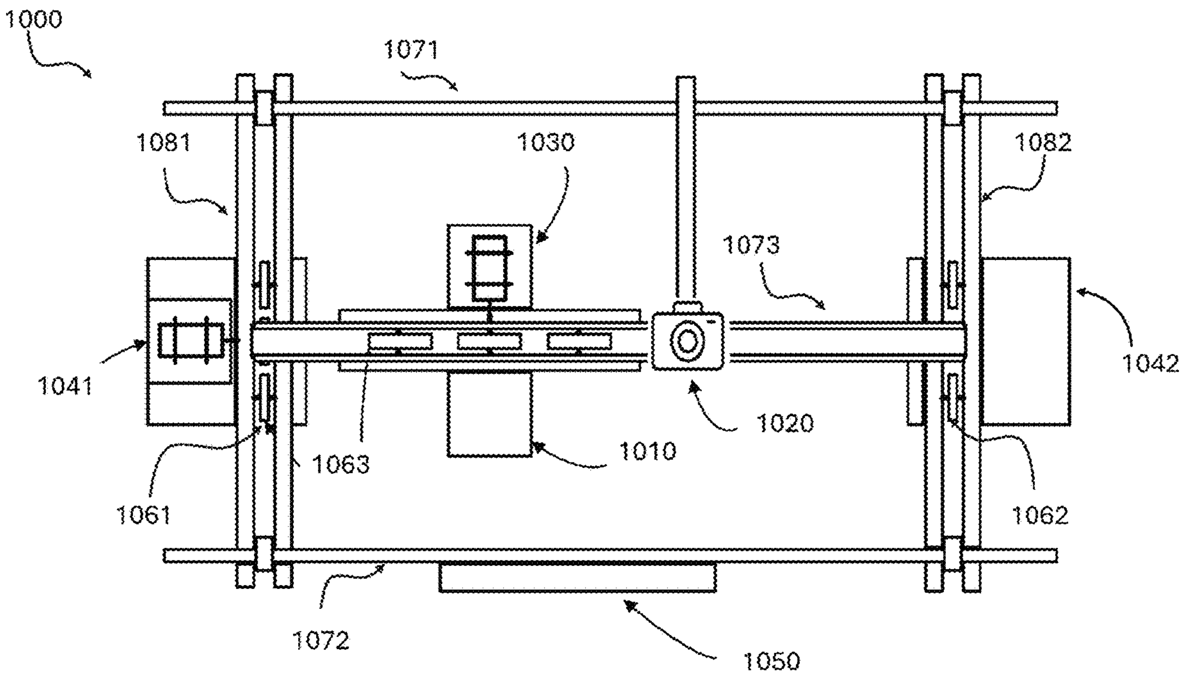
FIG. 1 is a top view of the high energy efficiency laser lighting system for high-value plantation, according to an embodiment of the invention.
Figure 2:
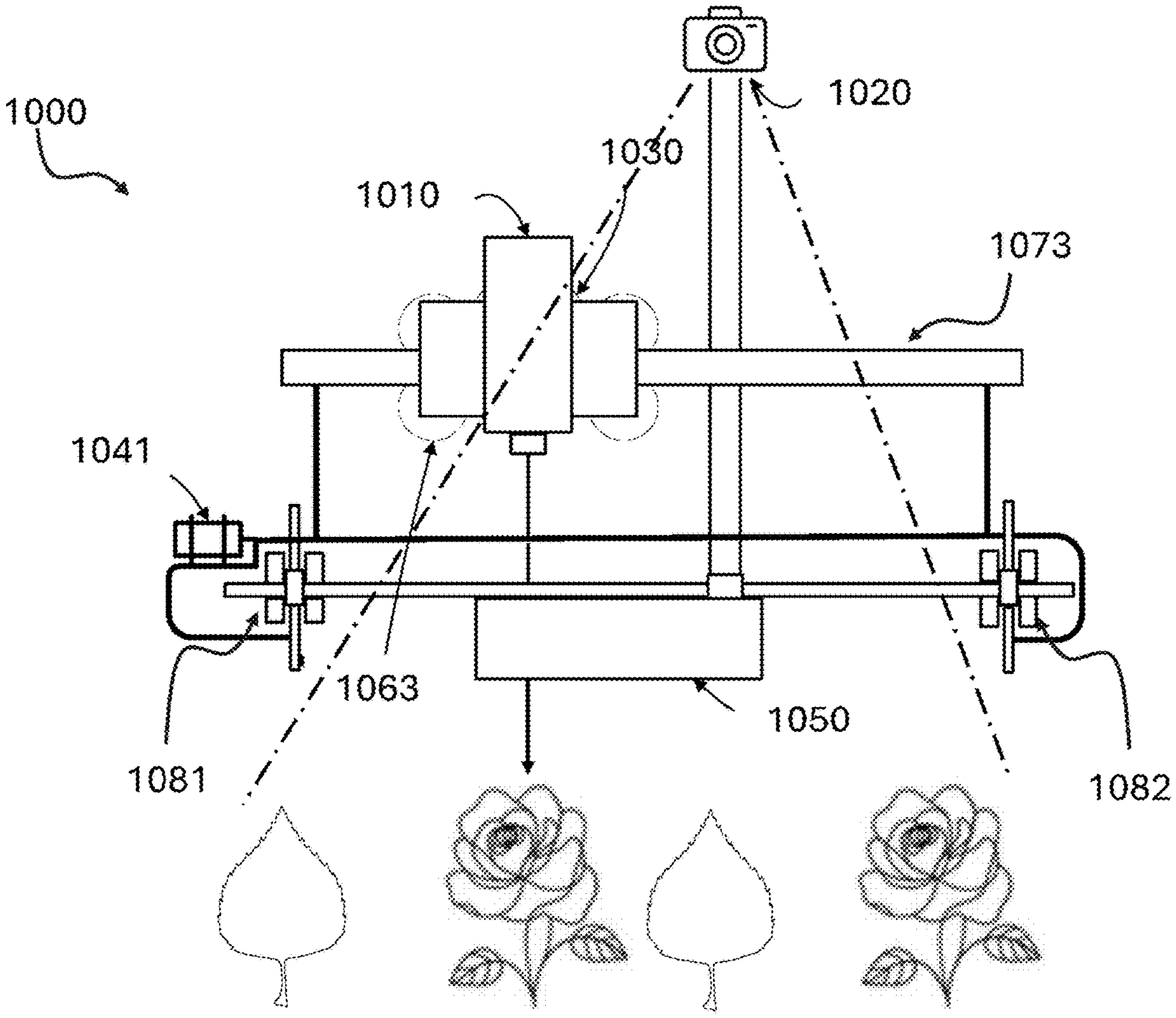
FIG. 2 is a side view of the high energy efficiency laser lighting system for high-value plantation, according to an embodiment of the invention.

FIGS. 1 through 3 are different views of the high energy efficiency laser lighting system for high-value plantation. FIG. 1 is a top view of the high energy efficiency laser lighting system for high-value plantation, according to an embodiment of the invention. FIG. 2 is a side view of the high energy efficiency laser lighting system for high-value plantation, according to an embodiment of the invention. FIG. 3A is a perspective view of the high energy efficiency laser lighting system for high-value plantation, according to an embodiment of the invention.

A high energy efficiency laser lighting system 1000 for high-value plantation is illustrated in a top view in FIG. 1. According to an embodiment of the invention, the high energy efficiency laser lighting system 1000 includes a pair of parallel y-tracks 1081 and 1082 along the y-direction deployed horizontally above target crops or plants. An x-direction is perpendicular to the y-direction and the x and y directions are in the same horizontal plane, which is typically parallel, or near parallel, to the floor of the indoor cultivation environment. According to an embodiment of the invention, a pair of x-frames 1071 and 1072 extend in the x-direction for supporting other elements of the system 1000, there can be more x-frames for supporting purposes, depending on the actual needs. The x-track 1073 is structure parallel to the x-frames 1071 and 1072, but the x-track 1073 does not have to be in the same plane as the x-frames 1071 and 1072.

According to an embodiment of the invention, a laser light source module 1010 is implemented on the x-track 1073, which supports and guides the movement of the laser light source module 1010 along the x-direction. The movement of the laser light source module 1010 along the x-track 1073 is driven by, for example, an x-step motor 1030, which is powered by a power source and controlled by a controller module 1050. Driven by the x-step motor 1030, the laser light source module 1010 moves along the x-track 1073 on a plurality of wheels 1063.

According to an embodiment of the invention, the x-track 1073, together with the x-step motor 1030 and the laser light source module 1010 implemented whereon, can move along the y-tracks 1081 and 1082 driven by at least one y-step motor 1041. The y-step motor 1041 drives the x-track 1073 to move along the y-track 1081 and 1082 on a plurality of wheels 1061 and 1062. 1042 can be another matching y-step motor, or a counterweight.

According to an embodiment of the invention, the controller module 1050 is implemented in a location without impeding the operation of any other modules or Dear components. The controller module 1050 can be located near the tracks, or away from the tracks, in locations that do not block the operation of other components.

According to an embodiment of the invention, the camera module 1020 takes pictures of the crops being cultivated and detects information such as distance and growing status. Such information is processed by the controller module 1050 to provide further control information for the laser light source module 1010, such as power, wavelength, PWM duty cycle, etc. for desired cultivation. FIG. 2 is a side view of the same system 1000.

According to an embodiment of the invention, the camera module 1020 is fixed in a position above the plants and can capture images of some or all the plants below. According to an embodiment of the invention, the camera module 1020 takes pictures of the plants being cultivated and at the same time measures the depth information of each pixel being pictured, the depth is the range, or distance from each pixel to a predetermine reference position.

As illustrated in FIG. 3A, which is a perspective of view of the system 1000 in FIG. 1 and FIG. 2, the laser light source module 1010 is supported and guided by the x-track 1073. The laser light source module 1010 is capable of moving along the x-track 1073 in the x-direction. As discussed above, the x-track 1073, together with the laser light source module 1010 supported on it, is guided and supported by at least a pair of y-tracks 1081 and 1082. With the x-track and γ-tracks, the laser light source module 1010 is capable of moving to any position [xi, yi] within a predetermine area from [x0, y0] to [xT, yT]. Such an area is, for example, a rectangle area defined by [x0, y0] and [xT, yT].

According to an embodiment of the invention, the camera module 1020 is fixed above the plants and is implemented to take pictures of the entire area defined by [x0, y0] and [xT, yT]. While taking a picture of the entire area defined by [x0, y0] and [xT, yT], the camera module 1020 also measures the range, or depth, information of each pixel relative to a predetermined reference point. For example, for each pixel [x1, y1] in the picture, the associated depth is d1, the associated RGB value is [r1, g1, b1]. For each pixel [x1, y1], [x1, y1, d1, r1, g1, b1] provides position, depth and color information. The corresponding matrix [X, Y, R, G, B] provides a color picture of the plants in the area, and the matrix [X, Y, D] provides a depth frame of the corresponding color picture, which is typically a grayscale picture with the grayscale value representing depth value for each pixel.

According to an embodiment of the invention, when a color picture [X, Y, R, G, B] is captured, the species of the plants within the area can be identified with algorithms embedded in the control module 1050. According to an embodiment of the invention, such algorithms can be AI algorithms.

Figure 4B:
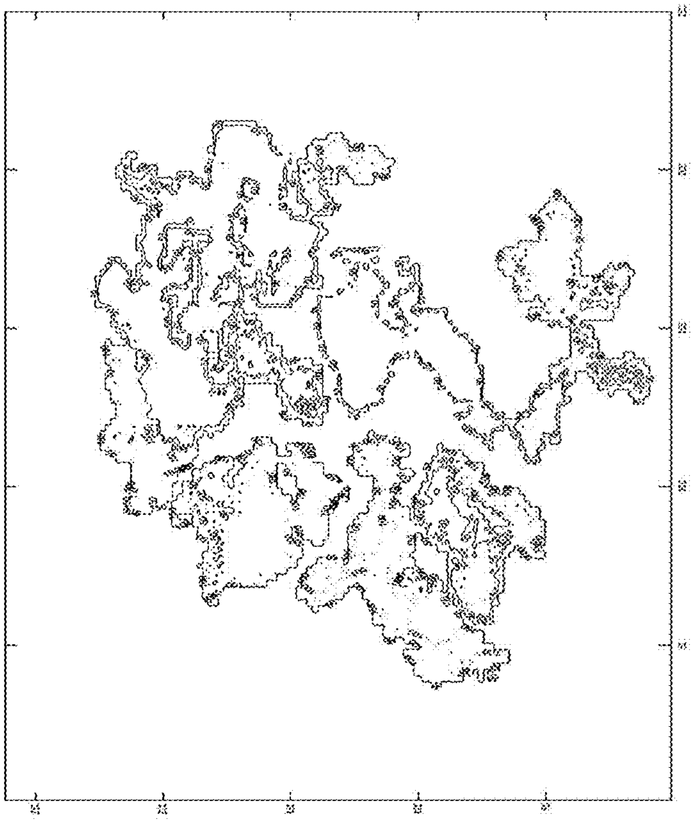
FIG. 4B is the laser module output power pattern corresponding to the exemplary depth frame in FIG. 4A, according to an embodiment of the invention.
Figure 4A:
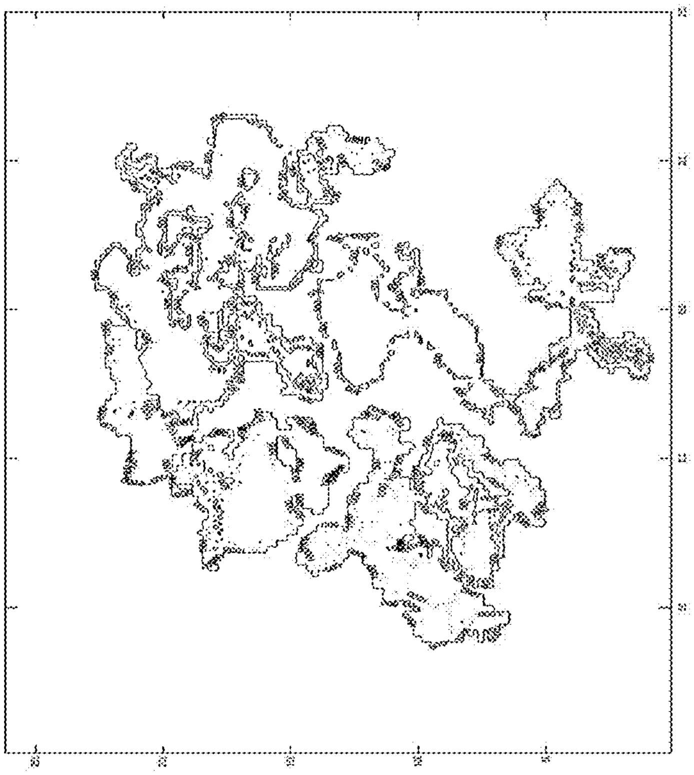
FIG. 4A is an exemplary depth frame obtained by the camera module, according to an embodiment of the invention.

According to an embodiment of the invention, a grayscale depth frame [X, Y, D] of a plant is illustrated in FIG. 3B, with g1, g2, g3 and g4 representing four adjacent grayscale values corresponding to four depth values. A pixel on this depth frame [x1, y1, d1] represents the depth value d1 at position [x1, y1]. When the plant species is determined, each depth value d1 can be converted into a corresponding laser intensity value at the [x1, y1] position for optimal plant growth, and laser intensity value further corresponds to laser power value and PWM duty cycle value. According to an embodiment of the invention, the matrix [x1, y1, d1] is converted into laser power intensity matrix [x1, y1, L1], as illustrated in FIG. 3C, with p1, p2, p3 and p4 representing four different power intensities corresponding to the depth values g1, g2, g3 and g4 in FIG. 3B. The details of the algorithms for converting [x1, y1, d1] into [x1, y1, L1] will be discussed in subsequent paragraphs. FIG. 4A is an example of the depth frame obtained by the 3D camera 1020, and FIG. 4B is the corresponding laser module output power pattern, according to an embodiment of the invention.

Figure 5:
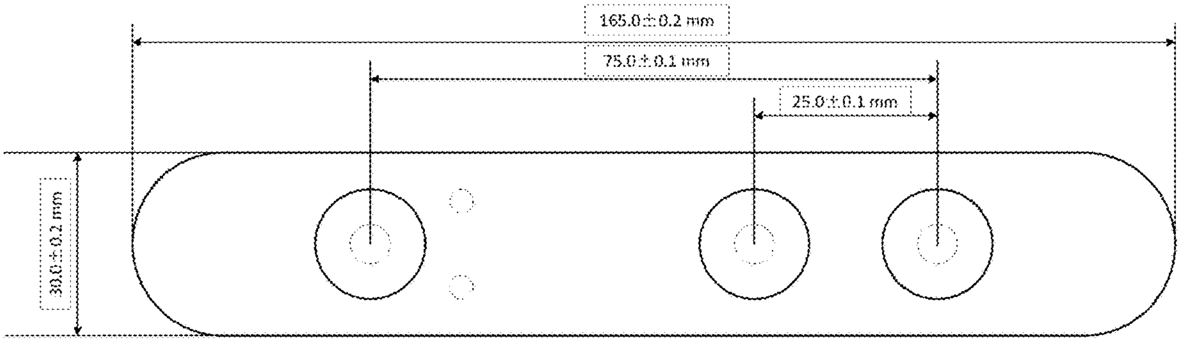
FIG. 5 is a Structured-light 3D scanner, or a 3D RGB-D camera, according to an embodiment of the invention.

In order to measure the range information of each pixel in the picture, according to an embodiment of the invention, the camera module 1020 is a 3D camera capable of capturing 3D information of the plants under it. According to an embodiment of the invention, the camera module 1020 is a structured-light 3D scanner camera. One example of such a structured-light 3D scanner is as illustrated in FIG. 5.

A structured-light 3D scanner camera is a device used for capturing the three-dimensional shape of an object by projecting light patterns onto its surface. These patterns, typically grids or stripes, deform as they interact with the object's contours. Cameras positioned at different angles capture these distortions, and specialized algorithms process the data to reconstruct a detailed 3D model.

Structured-light scanning relies on triangulation to determine depth and shape. A projector emits a predefined light pattern onto the object, while the cameras record how the pattern is distorted by the surface variations. By analyzing these distortions, the system calculates the spatial characteristics of the object with high precision. This technology enables accurate 3D scanning without requiring physical contact, making it valuable for applications where surface integrity must be preserved.

The primary components of a structured-light 3D scanner include the projector, cameras, processing software, and a calibration system. The projector, often using LEDs or lasers, generates structured light patterns that enhance depth perception. The cameras capture the reflected light patterns, and advanced processing software converts these images into high-resolution 3D data. Calibration ensures precise alignment between the projector and cameras, allowing for consistent and accurate measurements.

One of the major advantages of structured-light 3D scanning is its ability to achieve high accuracy and resolution, often with sub-millimeter precision. Additionally, these systems operate efficiently, scanning objects in seconds, which makes them ideal for industrial and commercial applications. Since structured-light scanners use non-coherent light sources, they avoid the safety concerns associated with laser-based scanning methods. This approach also proves versatile, as it is widely applied in areas such as industrial design, quality control, cultural heritage preservation, augmented reality, and medical imaging.

Despite its advantages, structured-light scanning does come with some limitations. The accuracy of scans can be affected by ambient lighting conditions, as external sources of light may interfere with the projected patterns. Highly reflective or transparent surfaces can also pose challenges, as they may distort the structured-light patterns, requiring additional coatings or modifications for reliable scanning. Furthermore, proper calibration is essential for ensuring consistent performance across different scanning environments.

Structured-light 3D scanners have gained popularity due to their precision, efficiency, and effectiveness in capturing complex shapes. Their ability to rapidly generate highly detailed 3D models makes them an invaluable tool in a range of industries.

3D RGB-D Camera commonly uses depth coordinate. With depth coordinates, each pixel in depth frame has a depth value, which is the distance between the camera plane and the object point represented by the pixel. Normally, the darker color in the depth frame indicates the closer distance of the object to the 3D RGB-D camera.

The structured-light 3D scanner Camera, as illustrated in FIG. 5, is a sophisticated depth-sensing device designed for applications in robotics, artificial intelligence, and interactive systems. It integrates RGBD (Red, Green, Blue, Depth) imaging technology, allowing it to capture both color and depth information simultaneously. This capability makes it particularly useful for facial recognition, gesture tracking, and environmental mapping.

One of the standout features of the structured-light 3D scanner Camera is its compatibility with SLAM (Simultaneous Localization and Mapping) technology, which enables robots to navigate and understand their surroundings in real time. By processing depth data, the camera helps autonomous systems build accurate 3D maps, making it ideal for applications in robotic vision, smart automation, and interactive gaming. The integration with ROS (Robot Operating System) further enhances its functionality, allowing developers to implement advanced algorithms for object detection, motion tracking, and spatial awareness.

The structured-light 3D scanner Camera is equipped with high-resolution sensors that provide precise depth measurements, ensuring reliable performance in various lighting conditions. Its infrared projector enhances depth perception, making it effective even in low-light environments. Additionally, the camera supports multiple recognition functions, including human skeleton tracking, facial expression analysis, and gesture-based controls, which are valuable for applications in healthcare, security, and augmented reality.

In terms of hardware, the structured-light 3D scanner Camera is designed for easy integration with robotic platforms. It features a compact and lightweight build, making it suitable for mobile robots and drones. The device also supports plug-and-play functionality, allowing seamless connectivity with computers and embedded systems. Its affordability and versatility have made it a popular choice among researchers and developers working on AI-driven projects.

Overall, the structured-light 3D scanner Camera is a powerful tool for depth sensing and interactive applications. Its combination of RGBD imaging, SLAM compatibility, and ROS integration makes it a valuable asset in fields ranging from robotics to virtual reality.

The following table provides one set of Camera Specifications of the structured-light 3D scanner Camera:

| Camera Specifications | |
|---|---|
| Depth Technology | Structured Light |
| Wavelength | 850 nm |
| Depth Range | 0.6-8 m |
| Depth Resolution | Up to 640 × 480@30 fps |
| Depth FOV | HFOV 58°/VFOV 45° |
| RGB Resolution | Up to 1920 × 1080@30 fps |
| RGB FOV | HFOV 66°/VFOV 40° |
| Precision: | +/−3 mm @ 1 m |

The following table provides one set of Physical Parameters of the structured-light 3D scanner Camera:

| Physical Parameters | |
|---|---|
| Data Connection | USB 2.0 Type-A |
| Power Input | USB 2.0 Type-A |
| Trigger | N/A |
| Power Consumption | Average <2.4 W |
| Operating Environment | 10° C.-40° C.; Indoor; 10%-85% RH |
| Data Output | Point Cloud, Depth Map, IR or RGB |
| Dimensions (W * H * D) | 165 mm × 30 mm × 40 mm |
| Weight | 310 g |

Figure 6B:
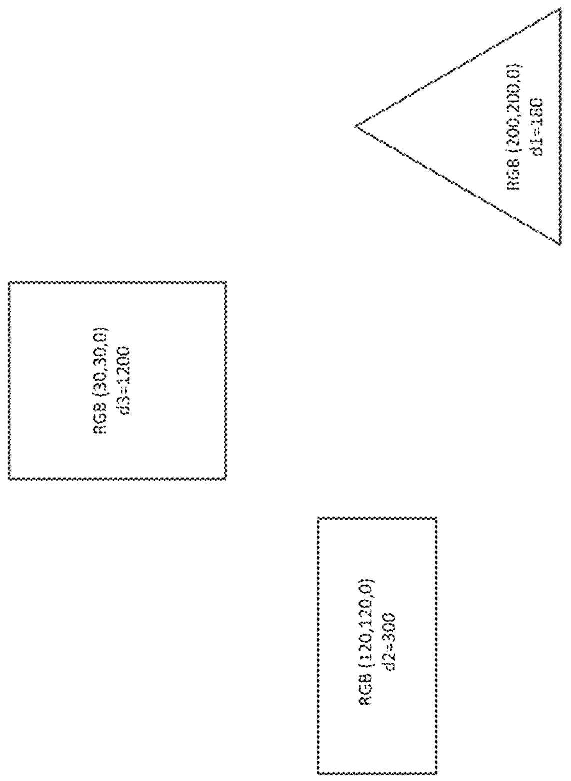
FIG. 6B is the depth frame of the exemplary scene in FIG. 6A obtained by the Structured-light 3D scanner in FIG. 5, according to an embodiment of the invention.
Figure 6A:
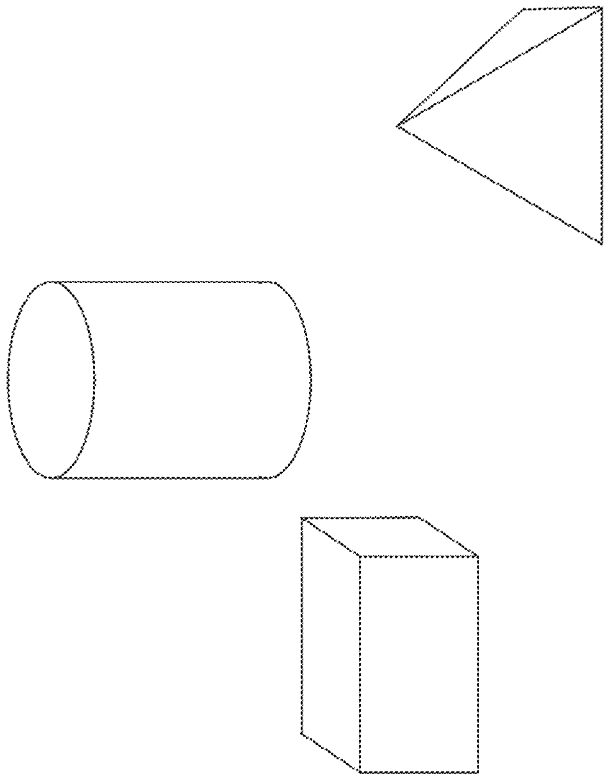
FIG. 6A is an exemplary scene presented to the Structured-light 3D scanner in FIG. 5, according to an embodiment of the invention.

According to an embodiment of the invention, FIG. 6A is an exemplary scene presented to the Structured-light 3D scanner in FIG. 5, FIG. 6B is the depth frame of the exemplary scene in FIG. 6A obtained by the Structured-light 3D scanner in FIG. 5.

Figure 7:
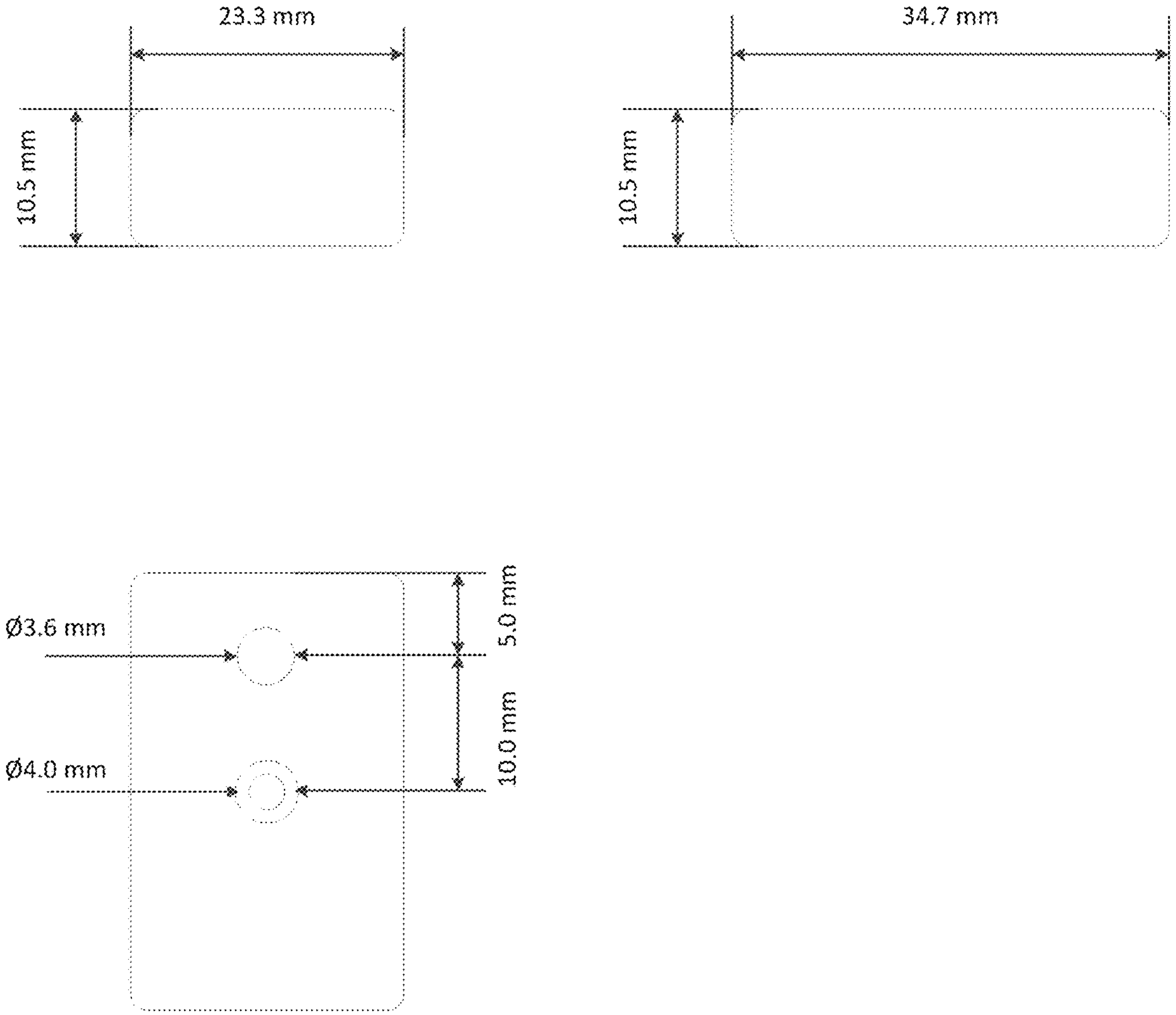
FIG. 7 is a Time-Of-Flight (TOF) sensor, according to an embodiment of the invention.

According to an embodiment of the invention, the camera module 1020 is a Time-Of-Flight (TOF) sensor or LiDAR, one example of which is as illustrated in FIG. 7.

Time-Of-Flight (TOF) sensors and LiDAR (Light Detection and Ranging) are two advanced depth-sensing technologies widely used in applications ranging from robotics and autonomous vehicles to industrial automation and augmented reality. Both operate on the principle of measuring the time it takes for light to travel to an object and back, allowing for precise distance calculations.

TOF sensors function by emitting a modulated light signal, typically infrared, and measuring the time delay between emission and reception. This delay is used to calculate the distance to the object with high accuracy. TOF sensors are commonly integrated into consumer electronics, such as smartphones for facial recognition, as well as in industrial automation for object detection and positioning. Their advantages include compact size, low power consumption, and real-time depth mapping capabilities. However, they are generally limited to short-to-medium range applications and may struggle with highly reflective or transparent surfaces.

LiDAR, on the other hand, employs laser pulses to scan an environment and generate detailed 3D maps. Unlike TOF sensors, which often rely on a single light source, LiDAR systems use multiple laser beams to create a dense point cloud representation of the surroundings. This technology is extensively used in autonomous vehicles for navigation, environmental monitoring, and topographical mapping. LiDAR offers superior accuracy and range compared to TOF sensors, making it ideal for applications requiring precise spatial data. However, it tends to be more expensive and power-intensive, which can be a limiting factor for certain implementations.

Both technologies have seen significant advancements in recent years, with improvements in sensor resolution, processing speed, and integration with artificial intelligence. As industries continue to demand more sophisticated depth-sensing solutions, TOF and LiDAR are expected to play an increasingly vital role in shaping the future of automation and spatial awareness.

One example of Time-Of-Flight (TOF) sensor supports a maximum resolution of 100×100 with 8-bit precision.

The TOF sensor can capture the distance to the objects and display a warm color when the object is close, and distance is short; a cool color when the object is far and distance is long.

The following table provides one set of exemplary descriptions of the Time-Of-Flight (TOF) sensor:

| Parameter | Description |
|---|---|
| CPU | 32-bit RISC CPU with FPU, Up to 144 MHz |
| Memory | 132 KB RAM & 192 KB ROM |
| Camera Size | 23.3 * 34.7 * 10.5 mm |
| Connector | USB Type-C, 1.25 mm Connector |
| External Interface | USB2.0, UART |
| TOF Camera Resolution | Up to 100 * 100 |
| TOF Camera Frame Rate | Up to 20 FPS |
| TOF Camera FOV | HFOV 70°/VFOV 60° |
| TOF Measurement Range | 0.2-2.5 m |
| TOF Distortion | <2.5% |
| TOF Wavelength | 940 nm |
| TOF Power Consumption | 3 W |
| TOF Measurement Accuracy | <=1%/<=1 cm |

Primary colors-red (R), green (G), and blue (B)—cannot be created by mixing other colors. When these primary colors are combined, they form secondary colors: orange (red+green, typical RGB triplet for orange is (255, 165, 0)), yellow (red+blue, typical RGB triplet for yellow is (255, 255, 0)), and violet (blue+red, typical RGB triplet for violet is (127, 0, 255)). Further mixing of primary and secondary colors results in tertiary colors, such as red-orange, yellow-green, and blue-violet.

One of the most important aspects is the distinction between warm and cool colors. Warm colors, including red, orange, and yellow, represent short distance. They are often associated with high red value in RGB triplet, for example, the red component for orange (255, 165, 0) is 255.

On the other side of the spectrum, cool colors—such as blue, green, and violet—are linked to long distances. They often have small red components in RGB triplet, for example, the red component for violet (127, 0, 255) is only 127.

The red component difference between warm and cool colors can be utilized to obtain the depth frame with the heat map captured by Time-Of-Flight (TOF) sensor.

Figure 8:
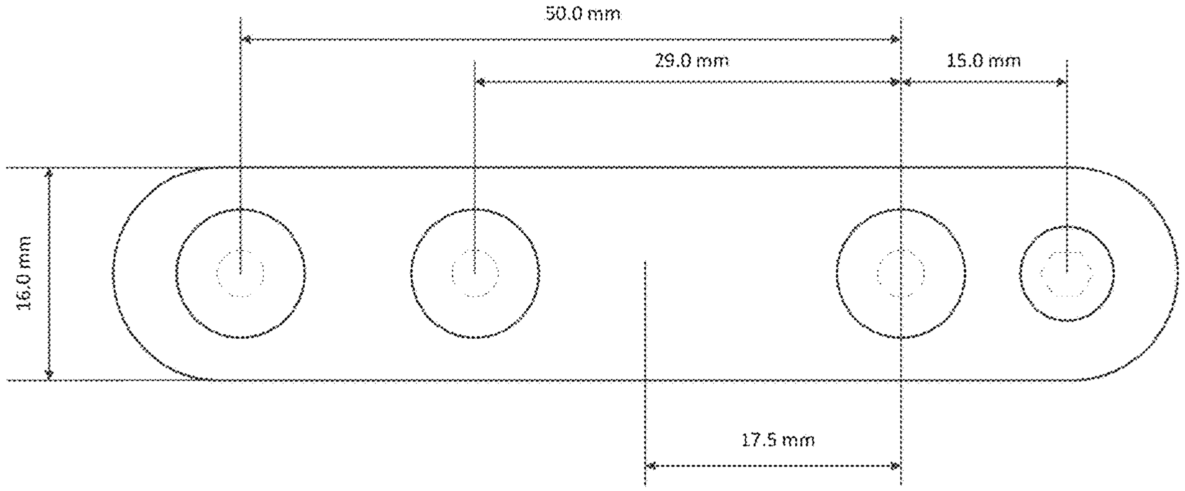
FIG. 8 illustrates certain technical parameters of the RGB-D stereo camera, according to an embodiment of the invention.

According to an embodiment of the invention. FIG. 8 illustrates certain technical parameters of the RGB-D stereo vision camera, according to an embodiment of the invention. According to an embodiment of the invention, the camera module 1020 is an RGB-D stereo vision camera. An RGB-D stereo vision camera is an advanced imaging device that captures both color (RGB) and depth (D) information simultaneously, making it highly valuable for applications requiring spatial awareness and 3D reconstruction. Unlike traditional cameras that only record color data, RGB-D stereo vision cameras integrate depth sensing technology to provide a more comprehensive understanding of an environment.

RGB-D stereo vision cameras are widely used in robotics, augmented reality, and computer vision applications. In robotics, they enable autonomous navigation by helping machines perceive obstacles and map their surroundings in three dimensions. In augmented reality, they enhance user experiences by allowing digital objects to interact seamlessly with real-world environments. Additionally, these cameras play a crucial role in facial recognition, gesture tracking, and industrial automation, where depth perception is essential for accurate object manipulation.

One of the key advantages of RGB-D stereo vision cameras is their ability to generate real-time depth maps, which are essential for applications requiring immediate spatial analysis. However, they also come with challenges, such as sensitivity to ambient lighting conditions and difficulties in capturing depth information for highly reflective or transparent surfaces. Despite these limitations, advancements in sensor technology continue to improve their accuracy and reliability.

Overall, RGB-D stereo vision cameras represent a significant leap in imaging technology, providing a richer and more detailed perspective of the world compared to conventional cameras. Their integration into various fields underscores their importance in shaping the future of computer vision and interactive systems.

The RGB-D stereo vision camera includes a left imager, and a right imager. The depth imaging processor calculates depth values for each pixel in the depth frame by correlating points on the left image captured by left imager to the right image captured by right imager The following table provides one set of exemplary product description of RGB-D stereo vision cameras:

| Use environment | Indoor/Outdoor |
|---|---|
| Features | |
| Ideal range | 0.3-3.0 m |
| Depth | |
| Depth technology | Stereoscopic |
| Minimum depth distance at max resolution | ~28 cm |
| Depth Accuracy | <2% @, 2 m |

-continued

| Use environment | Indoor/Outdoor |
|---|---|
| Image sensor technology | Global Shutter |
| Depth FOV | HFOV 87°/VFOV 58° |
| Depth output resolution | Up to 1280 × 720 |
| Depth frame rate | Up to 90 FPS |
| RGB | |
| RGB frame resolution | Up to 1920 × 1080 |
| RGB frame rate: | Up to 30 FPS |
| RGB sensor technology | Rolling Shutter |
| RGB sensor FOV | HFOV 69°/VFOV 42° |
| RGB sensor resolution | 2 MP |

These 3D cameras typically use a combination of stereo vision, structured light, or Time-Of-Flight (TOF) sensors to determine depth. Stereo vision relies on two cameras positioned at a fixed distance apart, mimicking human binocular vision to estimate depth by comparing disparities between the two images. Structured light systems project a known pattern onto a scene and analyze distortions to calculate depth, while TOF sensors measure the time it takes for light to bounce back from objects, providing precise distance measurements.

According to an embodiment of the invention, the laser light source module is controlled by PWM. Pulse-width modulation (PWM) is a widely used technique for controlling the power output of laser diodes, offering precise regulation of intensity while maintaining efficiency. This method works by rapidly switching the laser diode on and off at a high frequency, adjusting the duty cycle—the proportion of time the laser remains on within each cycle—to control the average power delivered to the diode.

One of the key advantages of PWM in laser diode power control is its ability to maintain stable operation while minimizing heat generation. Unlike continuous current regulation, which can lead to excessive thermal buildup, PWM allows the laser to operate at peak efficiency without overheating. This is particularly beneficial in applications requiring long-term stability, such as optical communication, medical imaging, and industrial laser processing.

By adjusting the modulation frequency and duty cycle, engineers can fine-tune the laser's output to match specific operational requirements. This is especially useful in applications where precise output power control with wide dynamic range is necessary, such as high-resolution scanning systems.

PWM control systems typically incorporate specialized drivers that manage the modulation process. These drivers ensure that the laser diode receives a consistent and controlled current, preventing fluctuations that could degrade performance. Advanced PWM controllers also integrate feedback mechanisms, allowing real-time adjustments based on environmental conditions or operational demands.

Despite its advantages, PWM control does have some limitations. High-frequency modulation can introduce noise into the laser output, which may affect applications requiring ultra-stable beams. Additionally, improper PWM settings can lead to inefficiencies or unintended variations in laser intensity. Engineers must carefully design and calibrate PWM systems to optimize performance while mitigating potential drawbacks.

Overall, PWM is a powerful and efficient method for regulating laser diode power, providing precise control over intensity and stability. Its ability to minimize heat buildup, and maintain operational efficiency makes it a preferred choice in the present invention.

Figure 9:
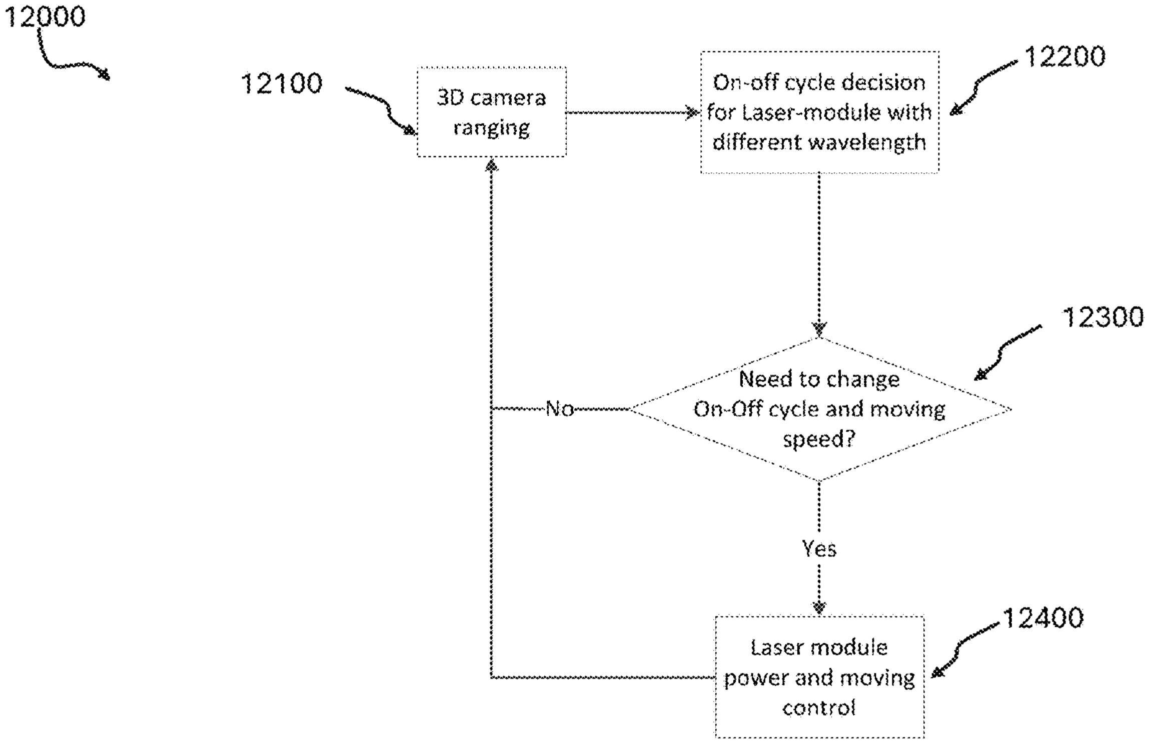
FIG. 9 is a flowchart of an integrated high energy efficiency laser lighting system for high-value plantation, according to an embodiment of the invention.

FIG. 9 is a flowchart of a control method of the high energy efficiency laser lighting system 1000, according to an embodiment of the invention. The control method 12000 includes a first step 12100, which measures the range of the plant in the current view with a 3D camera discussed above. In step 12100, the 3D camera measures the range, or depth, d of each pixel in the current view of the 3D camera to construct a depth matrix [X, Y, D], with a depth value di for each pixel [xi, yi]: [xi, yi, di]. As discussed above, the depth di, or range, is the distance between a pixel [xi, yi] and a predetermined reference point. The depth matrix [X, Y, D] is depicted as a grayscale map of the plant in view. In the next step 12200, when the depth matrix [X, Y, D] is converted into laser power matrix [X, Y, P]_λ, with pi represents the laser power required at pixel [xi, yi, pi] at a given wavelength λ: [xi, yi, pi] _λ.

Assuming the distance between the laser module 1010 and the plant is d (meter), the environment compensation coefficient is c, the light intensity on plant is:

Intensity_on_plant(Lux)=laser_output_power (mW) *c*0.683*(10^6)/(d^2), or:

$$\text{Intensity}_{OnPlant}(Lux) = \text{Laser}_{OutputPower}(mW)\cdot C\cdot 0.683\cdot\frac{10^6}{D^2}.$$

Accordingly, given the required Intensity_on_plant (Lux), the laser output power for position (x,y) with depth d is:

Laser_output_power (mW)=Intensity_on_plant (Lux)* (d^2)*1.46*(10^(−6))/c, or:

$$\text{Laser}_{OutputPower}(mW) = \text{Intensity}_{OnPlant}(Lux)\cdot 1.46\cdot d^2\cdot\frac{10^{-6}}{C}.$$

According to an embodiment of the invention, the laser power pi at pixel [xi, yi] is determined by PWM duty cycle ri for a given wavelength λ: [xi, yi, ri] _λ. PWM duty cycle ri is defined by Pulse Width/T×100%. Accordingly, the laser power matrix [X, Y, P] _λ can be converted into a laser PWM duty cycle matrix [X, Y, R] _λ for a given laser wavelength 2 in step 12200.

In the next step 12300, a decision is made whether the PWM duty cycle needs to be changed and whether the moving speed of the laser lighting module needs to be changed. If not, it goes back to step 12100. Otherwise, it goes to step 12400 to the power and moving control of the laser lighting module to change the power duty cycle and moving speed.

According to an embodiment of the invention, the laser lighting module includes a single beam of laser light and can only light up a single pixel at a time. And it depends on the scanning movement of the laser lighting module powered by the x-step motor and y step motor to scan all pixels within the current view. According to another embodiment of the invention, the laser lighting module includes a plurality of beams of laser light and can light up a plurality of pixels at a time. According to another embodiment of the invention, the laser lighting module includes an array, or a matrix, of laser beams which can light up an array or a matrix of pixels at a time. When the laser lighting module includes an array, or a matrix, of laser beams, the laser lighting module can be implemented as a bundle of optic fibers arranged in a predetermined array or matrix.

Figure 10:
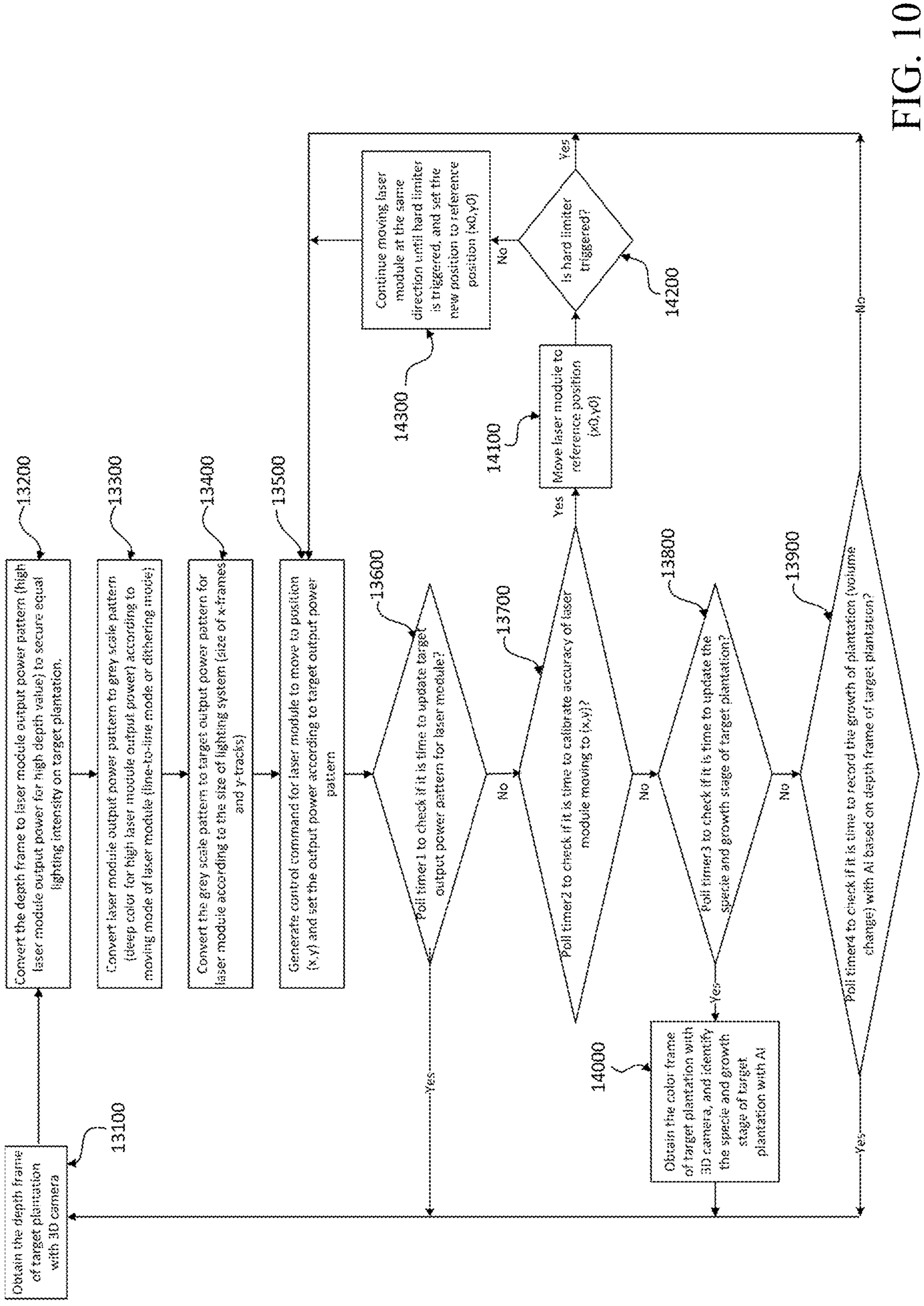
FIG. 10 is a flowchart of a control method of the high energy efficiency laser lighting system, according to an embodiment of the invention.

FIG. 10 is a flowchart of the method for converting a depth frame into laser power matrix, according to an embodiment of the invention. 13000 is a flowchart of the method. Step 13100, obtaining the depth frame of a target plant with the 3D camera module 1020. As discussed above, the 3D camera captures depth information for each pixel of the target plant within the view of the camera, and constructs a depth grayscale matrix [X, Y, D]. Step 13200, converting the depth frame to the output power pattern of the laser module 1010 to provide an appropriate lighting intensity on the target plant. For a given laser wavelength λ, the depth grayscale matrix [X, Y, D] is converted into a lighting intensity matrix [X, Y, L], where li is the lighting intensity at the pixel [xi, yi]: [xi, yi, li]. Assuming the depth, or the distance between laser module and plant is d (meter), the light intensity on plantation is:

Li=Intensity_on_plant_xi_yi(Lux)=Laser_output_power (mW)*c*0.683*(10^6)/(d^2), or:

$$Li = \text{Intensity}_{OnPlant-xi-yi}(Lux) = \text{Laser}_{OutputPower}(mW)\cdot C\cdot 0.683\cdot\frac{10^6}{d^2}.$$

Step 13300, converting laser module output power pattern to grey scale pattern (deep color for high laser module output power) according to moving mode of laser module 1010 (line-to-line mode or dithering mode.) Step 13400, converting the gray scale pattern to a target output power pattern of the laser module 1010 corresponding to the size of x-frames 1071 and 1072, and γ-tracks 1081 and 1082 in the lighting system. The target output power pattern is a target laser power matrix [X, Y, Q]_λ, with qi represents the laser power required at position [xi, yi, qi] within a predetermine area from [x0, y0] to [xT, yT] in FIG. 11 at a given wavelength λ: [xi, yi, qi] _λ. Step 13500, generating a control command for the laser module 1010 to move to a position (xi, yi) and setting the output power of the laser module 1010 corresponding to the target output power pattern.

Step 13600, polling timer #1 to check whether it is time to update target output power pattern for the laser module 1010. Step 13700, polling timer #2 to check whether it is time to calibrate accuracy of the laser module 1010 moving to position (x0, y0). Step 13800, polling timer #3 to check whether it is time to update the plant species and growth stage of the target plant. Step 13900, polling timer #4 to check whether it is time to record the growth of the plant with an AI method based on the depth frame of the target plant. Step 14000, obtaining the color frame of the target plant with the 3D camera 1020 and identifying the species and growth stage of the target plant with the AI method. Step 14100, moving the laser module to the reference position (x0, y0). Step 14200, whether the hard limiter is triggered? Step 14300, continuing to move the laser module in the same direction until a hard limiter is triggered, and setting the new position to the reference position (x0, y0).

For example, the lighting system is used as a light source to provide lighting for a pink rose tree, which is about 800 mm tall, in a dark room. Regular LED lighting system for this size of rose normally requires power consumption above 500 Watt. The power consumption of proposed lighting system is below 10 Watt, and it waives the need to install any air conditioner for heat dissipation, since the power consumption of lighting system is significantly reduced. High power lighting systems will generate large amount of heat, which hence incurs extra devices and power consumption for heat dissipation. With the proposed laser lighting system, pink rose tree grew very well, and it budded and bloomed as regular rose grown outdoor with sunlight. The growth stages of a pink rose tree and the output powers with the proposed lighting system are illustrated in Table 1 below:

| Rose Growth Stage | Laser Module Output Power (mw) | Rose Height (mm) |
|---|---|---|
| Vegetative | 18-240 | 400-600 |
| Flowering | 40-350 | 600-800 |

Figure 11:
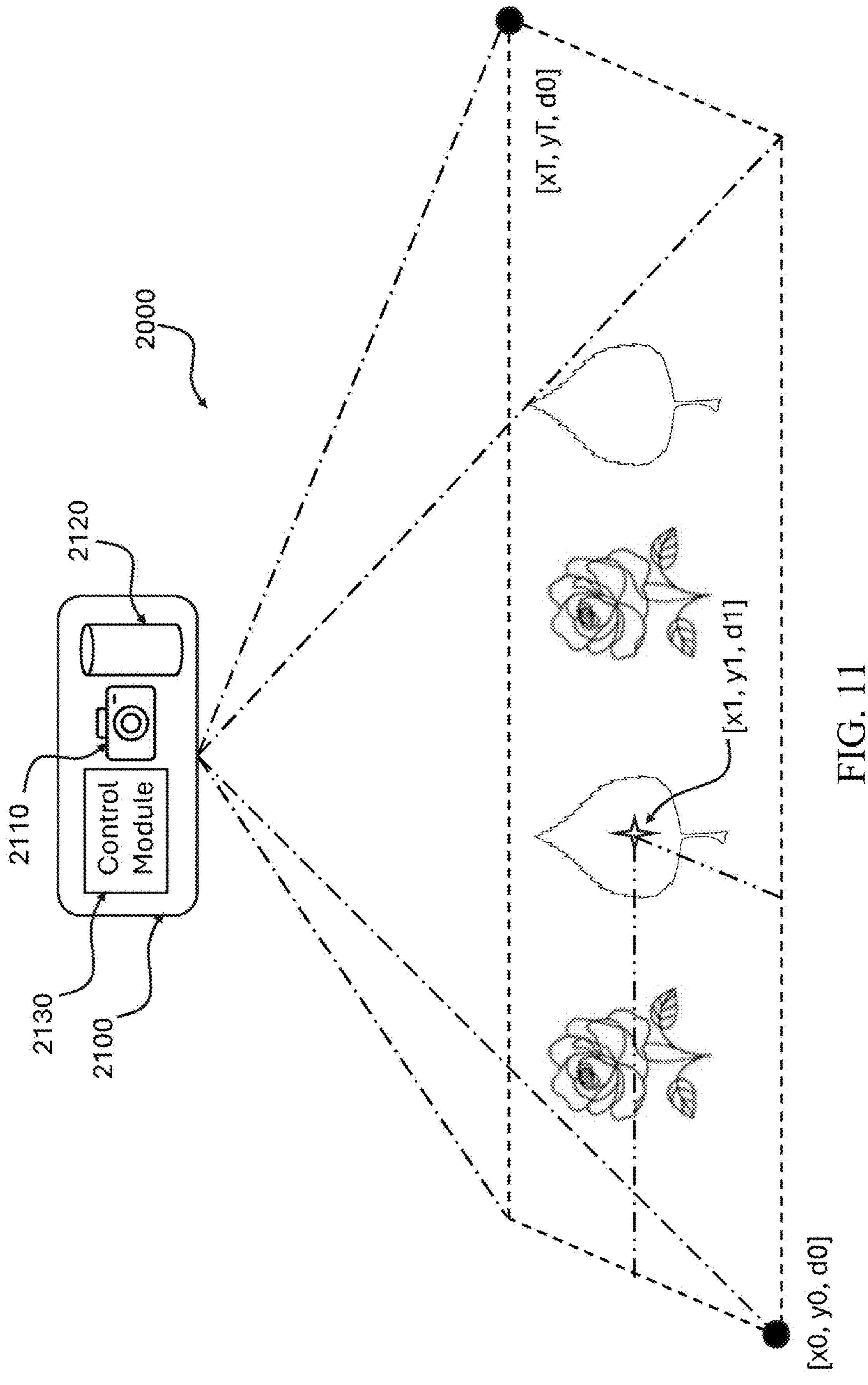
FIG. 11 is a schematic diagram of another control method of the high energy efficiency laser lighting system, according to an embodiment of the invention.

FIG. 11 is a schematic diagram of an integrated high energy efficiency laser lighting system 2000 for high-value plantation, according to an embodiment of the invention. The integrated high energy efficiency laser lighting system 2000 for high-value plantation is similar to the high energy efficiency laser lighting system 1000 illustrated in FIGS. 1-3, the differences include, that the camera module 2110, the laser lighting module 2120 and the control module 2130 are integrated together inside the enclosure 2100, and instead of using x and y step motors to scan the laser beam through the entire cultivation area, other scanning mechanism are implemented without moving the laser lighting module itself. Such alternative scanning mechanisms include, for example, a rotating mirror, or a prism, or MEMS micro-mirrors, as typically seen in laser scanning applications, such as those in LiDAR applications.

One of the fundamental laser scanning techniques is the oscillating mirror method. In this approach, a laser beam is directed onto a rapidly moving mirror that oscillates back and forth, allowing the laser pulses to sweep across a wide area. This method is commonly used in airborne LiDAR systems for topographic mapping, as it enables efficient coverage of large terrains with high precision.

Another widely used scanning mechanism is the rotating polygon mirror system. This technique employs a multi-faceted mirror that spins at high speeds, directing laser pulses in multiple directions. The advantage of this system is its ability to achieve rapid data collection, making it ideal for applications such as autonomous vehicle navigation and infrastructure monitoring.

Fiber-optic scanners represent a more advanced laser scanning mechanism in LiDAR. These systems use fiber-optic technology to manipulate laser beams, allowing for highly controlled and precise scanning patterns. Fiber-optic LiDAR is often used in industrial applications where extreme accuracy is required, such as in manufacturing quality control and robotic vision systems.

MEMS, or Microelectromechanical Systems, arrays play a crucial role in laser scanning mechanisms, offering compact, high-speed, and cost-effective solutions for depth sensing and environmental mapping. These arrays consist of tiny mirrors or actuators that dynamically adjust the direction of laser beams, enabling precise scanning across a wide field of view.

One of the primary advantages of MEMS-based scanning systems is their ability to achieve rapid scanning while maintaining a small form factor. Unlike traditional mechanical scanning systems that rely on bulky rotating components, MEMS mirrors operate using electrostatic or electromagnetic actuation, allowing for faster response times and reduced power consumption.

MEMS arrays also enhance the resolution and accuracy of laser scanning systems by enabling fine control over beam steering. MEMS-based scanning systems are more resistant to mechanical wear and vibration, increasing their reliability in harsh environments.

Other and various embodiments within the scope of the invention will be readily evident to practitioners skilled in the art, from specification, figures and claims that follow.

What is claimed is:

1. A laser lighting system for indoor high-value cultivation, the laser lighting system for indoor high-value cultivation comprising:
- a laser light source module for providing laser lighting for the laser lighting system for indoor high-value cultivation;
- a camera module for monitoring and measuring conditions of plants being cultivated;
- a plurality of y-tracks extending in a y-direction for supporting and guiding movements of at least the laser light source module along the y-direction;
- a plurality of x-tracks extending in an x-direction for supporting and guiding movements of at least the laser light source module along the x-direction,
- wherein the x-direction is perpendicular to the y-direction,
- wherein both the x-direction and the y-direction are in a horizontal plane;
- at least a y-step motor for driving at least the laser light source module along the plurality of y-tracks;
- at least a x-step motor for driving at least the laser light source module along the plurality of x-tracks; and
- a controller module connecting the laser light source module, the camera module, the at least one y-step motor and the at least one x-step motor,
- wherein the controller module controls the at least one y-step motor, the at least one x-step motor, and the laser light source module for providing lighting to the crops in response to inputs received from the camera module.

2. The laser lighting system for indoor high-value cultivation of claim 1, wherein the laser light source module provides more than one wavelength of laser.

3. The laser lighting system for indoor high-value cultivation of claim 2, wherein the laser light intensity can be manipulated by adjusting PWM duty cycle of the laser light source module, or the movement of the x-step motor and γ-step motor.

4. The laser lighting system for indoor high-value cultivation of claim 1, wherein the laser light source module is implemented as a bundle of optic fibers, wherein each of the optic fibers within the bundle provides a beam of laser with an independent wavelength, power and PWM duty cycle.

5. The laser lighting system for indoor high-value cultivation of claim 1, wherein the camera module further comprises a 3D camera.

6. The laser lighting system for indoor high-value cultivation of claim 1, wherein the camera module further comprises a Time-Of-Flight (TOF) sensor.

7. The laser lighting system for indoor high-value cultivation of claim 1, wherein the camera module further comprises a structured-light 3D scanner.

8. The laser lighting system for indoor high-value cultivation of claim 1, wherein the camera module further comprises an RGB-D stereo camera.

9. The laser lighting system for indoor high-value cultivation of claim 1, wherein the camera module captures a picture of plants being cultivated with depth information of each pixel in the picture, wherein an AI machine vision method is implemented to identify species of the plants being cultivated to facilitate a determination of optimal laser light source wavelengths and power intensities for optimal plant cultivation.

10. The laser lighting system for indoor high-value cultivation of claim 9, wherein the depth information of each pixel in the picture captured by the camera module is implemented to facilitate the determination of optimal laser light source wavelengths and power intensities for optimal plant cultivation.

11. A method for controlling a laser lighting system for an indoor high-value cultivation environment of plants, the method comprising:

deploying a 3D camera above the plants in the indoor high-value cultivation environment, wherein the 3D camera captures a picture of the plants with depth information for each pixel in the picture;

deploying a laser lighting module in the indoor high-value cultivation environment of plants, wherein a beam of laser light of the laser lighting module is implemented to reach each location associated with each of the pixel in the picture;

identifying species of the plants in the picture with an AI machine vision module;

constructing a depth frame with the depth information corresponding to the picture;

determining an optimal laser wavelength, an optimal laser power intensity, and an optimal laser PWM duty cycle for each pixel in the picture;

constructing a laser lighting module output power pattern with the optimal laser wavelength, the optimal laser power intensity and the optimal laser PWM duty cycle for each pixel in the picture; and shooting a beam of laser light to a location associated with a pixel in the picture with the optimal laser wavelength, the optimal laser power intensity and the optimal laser PWM duty cycle associated with the pixel.

12. The method for controlling a laser lighting system for an indoor high-value cultivation environment of plants in claim 11, further comprises:

shooting a second beam of laser light to a second location associated with a second pixel in the picture with the optimal laser wavelength, the optimal laser power intensity and the optimal laser PWM duty cycle associated with the second pixel.

13. The method for controlling a laser lighting system for an indoor high-value cultivation environment of plants in claim 12, further comprises:

for each of the pixel in the picture, shooting a beam of laser light with an optimal laser wavelength, an optimal laser power intensity and an optimal laser PWM duty cycle associated with the each of the pixel in the picture.

14. The method for controlling a laser lighting system for an indoor high-value cultivation environment of plants in claim 11, wherein at least an x-step motor and a y-step motor are implemented for the laser lighting module to reach each location associated with each of the pixel in the picture.

15. The method for controlling a laser lighting system for an indoor high-value cultivation environment of plants in claim 11, wherein a prism is implemented for the laser lighting module to reach each location associated with each of the pixel in the picture.

16. The method for controlling a laser lighting system for an indoor high-value cultivation environment of plants in claim 11, wherein an array of optic fibers are implemented for the laser lighting module to reach each location associated with each of the pixel in the picture.

* * * * *